(12) United States Patent
Arvin et al.

(10) Patent No.: US 9,853,006 B2
(45) Date of Patent: Dec. 26, 2017

(54) SEMICONDUCTOR DEVICE CONTACT STRUCTURE HAVING STACKED NICKEL, COPPER, AND TIN LAYERS

(71) Applicant: GLOBALFOUNDRIES INC., Grand Cayman (KY)

(72) Inventors: Charles L. Arvin, Poughkeepsie, NY (US); Harry D. Cox, Rifton, NY (US); Eric D. Perfecto, Poughkeepsie, NY (US); Thomas A. Wassick, LaGrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/191,723

(22) Filed: Jun. 24, 2016

(65) Prior Publication Data
US 2016/0307860 A1    Oct. 20, 2016

Related U.S. Application Data

(62) Division of application No. 14/467,191, filed on Aug. 25, 2014, now Pat. No. 9,396,991.

(51) Int. Cl.
*H01L 23/00* (2006.01)
*H01L 23/532* (2006.01)
(Continued)

(52) U.S. Cl.
CPC .......... *H01L 24/11* (2013.01); *H01L 21/6835* (2013.01); *H01L 21/76829* (2013.01);
(Continued)

(58) Field of Classification Search
CPC ... H01L 2224/0508; H01L 2224/05082; H01L 2224/05083; H01L 2224/05084;
(Continued)

(56) References Cited

U.S. PATENT DOCUMENTS 6,224,690 B1   5/2001   Andricacos et al.
8,395,051 B2   3/2013   Pang et al.
(Continued)

OTHER PUBLICATIONS

Ni/Cu/Sn Bumping Scheme for Fine-pitch Micro-bump Connections, W. Zhang et al., Electronic Components and Technology Conference, pp. 109-113, 2011.*

*Primary Examiner* — Kevin Parendo
(74) *Attorney, Agent, or Firm* — Anthony Canale; Andrew M. Calderon; Roberts Mlotkowski Safran Cole & Calderon, P.C.

(57) ABSTRACT

A three dimensional multi-die package includes a first die and second die. The first die includes a contact attached to solder. The second die is thinned by adhesively attaching a handler to a top side of the second die and thinning a bottom side of the second die. The second die includes a multilayer contact of layered metallurgy that inhibits transfer of adhesive thereto. The layered metallurgy includes at least one layer that is wettable to the solder. The multilayer contact may include a Nickel layer, a Copper layer upon the Nickel layer, and a Nickel-Iron layer upon the Copper layer. The multilayer contact may also include a Nickel layer, a Copper-Tin layer upon the Nickel layer, and a Tin layer upon the Copper-Tin layer.

17 Claims, 7 Drawing Sheets

(51) Int. Cl.
  *H01L 25/00* (2006.01)
  *H01L 25/065* (2006.01)
  *H01L 21/768* (2006.01)
  *H01L 21/683* (2006.01)

(52) U.S. Cl.
  CPC .. *H01L 21/76838* (2013.01); *H01L 21/76841* (2013.01); *H01L 23/53228* (2013.01); *H01L 23/53238* (2013.01); *H01L 24/03* (2013.01); *H01L 24/05* (2013.01); *H01L 24/13* (2013.01); *H01L 24/16* (2013.01); *H01L 24/29* (2013.01); *H01L 25/0657* (2013.01); *H01L 25/50* (2013.01); *H01L 24/81* (2013.01); *H01L 2221/6834* (2013.01); *H01L 2221/68327* (2013.01); *H01L 2221/68381* (2013.01); *H01L 2224/0345* (2013.01); *H01L 2224/0346* (2013.01); *H01L 2224/0347* (2013.01); *H01L 2224/0361* (2013.01); *H01L 2224/03849* (2013.01); *H01L 2224/03912* (2013.01); *H01L 2224/0401* (2013.01); *H01L 2224/0558* (2013.01); *H01L 2224/0566* (2013.01); *H01L 2224/05611* (2013.01); *H01L 2224/05647* (2013.01); *H01L 2224/05655* (2013.01); *H01L 2224/10145* (2013.01); *H01L 2224/1146* (2013.01); *H01L 2224/1147* (2013.01); *H01L 2224/11849* (2013.01); *H01L 2224/11901* (2013.01); *H01L 2224/13005* (2013.01); *H01L 2224/13006* (2013.01); *H01L 2224/1308* (2013.01); *H01L 2224/1316* (2013.01); *H01L 2224/13016* (2013.01); *H01L 2224/13111* (2013.01); *H01L 2224/13147* (2013.01); *H01L 2224/13155* (2013.01); *H01L 2224/16145* (2013.01); *H01L 2224/16238* (2013.01); *H01L 2224/81191* (2013.01); *H01L 2224/81193* (2013.01); *H01L 2224/94* (2013.01); *H01L 2225/06513* (2013.01)

(58) Field of Classification Search
  CPC . H01L 2224/05647; H01L 2224/05611; H01L 2224/05655
  See application file for complete search history.

(56) References Cited

U.S. PATENT DOCUMENTS

| | | | |
|---|---|---|---|
| 8,680,675 | B2 | 3/2014 | Daubenspeck et al. |
| 8,748,305 | B2 | 6/2014 | Chen |
| 8,754,524 | B2 | 6/2014 | Curtis et al. |
| 2006/0068595 | A1* | 3/2006 | Seliger .............. H01L 21/304 438/737 |
| 2008/0142968 | A1 | 6/2008 | Jadhav et al. |
| 2011/0156256 | A1 | 6/2011 | Kang et al. |
| 2013/0037946 | A1 | 2/2013 | Kim et al. |
| 2013/0099380 | A1* | 4/2013 | Chen .................. H01L 24/11 257/738 |
| 2014/0159203 | A1 | 6/2014 | Liu et al. |
| 2014/0262458 | A1 | 9/2014 | Arvin et al. |
| 2015/0115440 | A1* | 4/2015 | Higuchi ............... H01L 24/05 257/737 |

* cited by examiner

US 9,853,006 B2

SEMICONDUCTOR DEVICE CONTACT STRUCTURE HAVING STACKED NICKEL, COPPER, AND TIN LAYERS

FIELD

Embodiments of invention generally relate to semiconductor devices, design structures for designing a semiconductor device, and semiconductor device fabrication methods. More particularly, embodiments relate to a contact structure (e.g. pillar, receiving pad, etc.) interconnect for semiconductor chip-to-package applications.

BACKGROUND

A contact is a semiconductor chip-to-package interconnect technology. The advantages in the contacts lie in the extendibility to finer pitch and the superior electromigration (EM) performance. The contacts may be made from copper and the finer pitch is due to the contact's vertical sidewall.

In traditional copper contact technology, a small amount of solder is still required to connect the copper contacts of the chip to the receiving pads. Sometimes, as shown in FIG. 1, the solder may wet the upper surface and sidewall of the contact. In some applications contact wetting may be beneficial. For example, in implementations where solder is attached a receiving pad of a substrate or carrier, the contact may include wettable surfaces to ensure adequate electrical connection between the chip and package.

Chip fabrication processes typically require an application of adhesive to the wafer subsequent to formation of various contacts. For example, a handler is attached to the contact side of a wafer using an adhesive. In subsequent chip fabrication process the adhesive is removed from the chip wafer. In some instances, traditional copper contacts react poorly with the adhesive resulting in non-wettable surfaces.

SUMMARY

In an embodiment of the present invention, a semiconductor device fabrication method includes: forming a barrier layer upon a dielectric layer, forming an electrically conductive plating layer upon the barrier layer, and forming a multilayered contact upon the plating layer by plating a Nickel layer upon the plating layer, plating a Copper layer upon the Nickel layer, and plating a Nickel-Iron layer upon the Nickel layer.

In another embodiment of the present invention, a semiconductor device fabrication method includes forming a barrier layer upon a dielectric layer, forming an electrically conductive plating layer upon the barrier layer, and forming a multilayered contact upon the plating layer by plating a Nickel layer upon the plating layer, plating a Copper layer upon the Nickel layer, and plating a Tin layer upon the Nickel layer.

In another embodiment of the present invention, a three dimensional multiple die package includes a first die comprising a contact attached to solder and a second die that is thinned by adhesively attaching a handler wafer to a top side of the second die and thinning a bottom side of the second die, the second die comprising a multilayer contact upon the top side, the multilayer contact comprising layered metallurgy that inhibits transfer of adhesive thereto and wherein at least one layer of the multilayer contacts is wettable to the solder. In certain embodiments, the multilayer contact includes a Nickel layer, a Copper layer upon the Nickel layer, and a Nickel-Iron layer upon the Copper layer. In other embodiments, the multilayer contact includes a Nickel layer, a Copper-Tin layer upon the Nickel layer, and a Tin layer upon the Copper-Tin layer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures or methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to contact structures comprising multiple layers with wettable surfaces after the adhesive removal fabrication stage of the associated chip. In certain embodiments the contact pads comprise metallurgy which prevents the adhesive from transferring or remaining upon the contacts during removal, enable the contacts to be wettable to solder to enable an improved electrical interface during chip-to-package assembly and improved electromigration performance.

Referring now to the FIGs, wherein like components are labeled with like numerals, exemplary fabrication steps and corresponding structure in accordance with embodiments of the present invention are shown, and will now be described in greater detail below. It should be noted that some of the FIGs depict cross section views. Furthermore, it should be noted that while this description may refer to components in the singular tense, more than one component may be depicted throughout the figures or a real world implementation of the embodiments of the present invention. The specific number of components depicted in the figures and the cross section orientation was chosen to best illustrate the various embodiments described herein.

Figure 1:
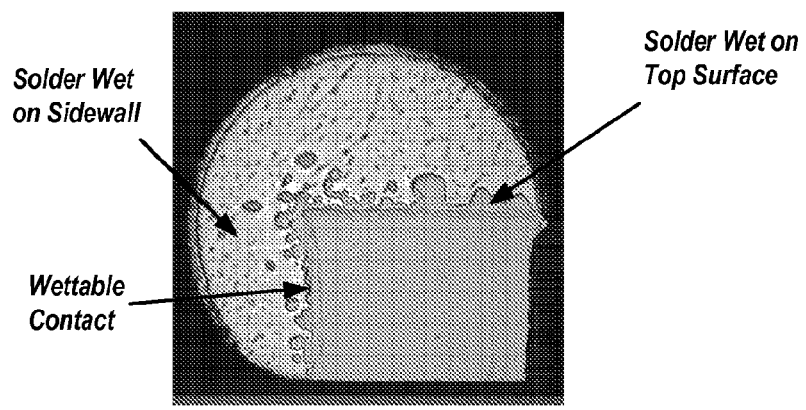
FIG. 1 depicts a contact structure with wettable surfaces.
Figure 2:
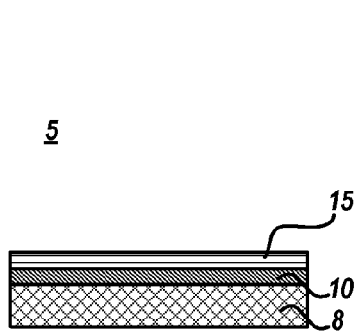
FIG. 2-FIG. 9 depicts fabrication processes and respective contact structures, according to embodiments of the invention.

FIG. 2-FIG. 9 show processes and respective structures in accordance with various embodiments of the invention. In particular, FIG. 2 shows a structure 5 (e.g. semiconductor chip, etc.) at an initial stage of fabrication. The structure 5 includes a liner 10 such as, for example, Ti, Ti tungsten, or Ti tungsten chrome copper formed upon a dielectric layer 8, such as a semiconductor substrate. In a particular embodiment, liner 10 is a TiW layer. In embodiments, the liner 10 can be, for example, about 0.165 microns thick, but can range from about 0.125 to 0.205 microns in thickness, amongst other desirable dimensions. In embodiments, the liner 10 can act as an adhesion layer to the underlying dielectric layer 8, a barrier layer to prevent solder from penetrating the underlying materials or components, etc.

Still referring to FIG. 2, a conductive layer 15 is formed upon the liner 10 using e.g. conventional processes. For example, the conductive layer 15 can be deposited using a sputtering technique or other known metal deposition techniques. In embodiments, the conductive layer 15 may be, for example, copper or other conductive materials such as, for example, nickel, nickel alloys, copper alloys, etc. In a particular embodiment, the conductive layer 15 is copper. The conductive layer 15 may be about 0.45 microns thick; although other dimensions are also contemplated by the present invention such as, for example, a range of about between 0.1 to 0.6 microns. In certain embodiments, conductive layer 15 is utilized as a shorting layer where electrical contact is made with a plating tool during plating operations to e.g. form contact structures upon the semiconductor chip, etc.

Figure 3:
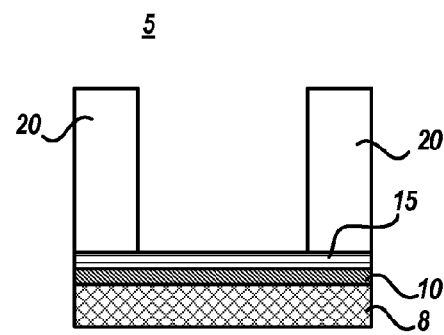

FIG. 3 shows structure 5 at a stage of fabrication wherein a contact trench 25 is formed. At the present stage of fabrication, photoresist material 20 is deposited on the conductive layer 15 using conventional deposition techniques such as, for example, dry film lamination or spin on liquid resist. The photoresist material 20 is then subjected to conventional lithographic and etching processes to remove a portion of the photoresist 20 to form an opening or trench 25 that exposes conductive layer 15 therein. In certain embodiments, an argon/oxygen or nitrogen RIE ash may be performed to refresh the trench 25 surfaces prior to contact formation therein.

Figure 4:
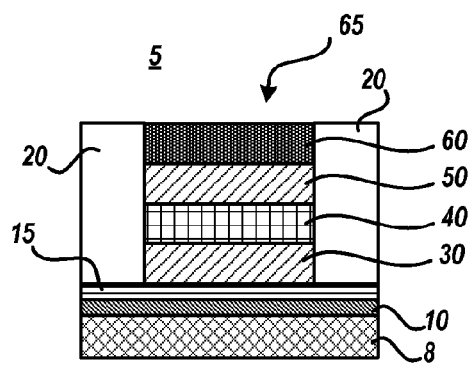

FIG. 4 shows structure 5 at a stage of fabrication wherein a layered contact 65 is formed within trench 25. In embodiments, layered contact 65 comprises a Nickel layer 30 formed upon the exposed conductive layer 15 within trench 25, a Copper layer 40 formed upon Nickel layer 30 within trench 25, a Nickel layer 50 formed upon Copper layer 40 within trench 25, and a NiFe layer 60 formed upon Nickel layer 50 within trench 25. In various embodiments, Nickel layer 30, Copper layer 40, Nickel layer 50, and NiFe layer 60 are formed by plating operations. Nickel layer 30, Copper layer 40, Nickel layer 50, and NiFe layer 60 may each be about 1 microns in thickness; although other dimensions are also contemplated by the invention such as, for example, a range of about between 0.5 to 15 microns. In certain embodiments contact 65 may be formed as a pillar contact of an exemplary thickness of 20 to 60 microns, etc. In embodiments, the upper surface of NiFe layer 60 may be subjected to a RIE process to clean the surface thereof.

In certain embodiments, solder may be formed upon NiFe layer 60 within trench 25. More particularly, solder may be deposited upon the NiFe layer 60 using, for example, another plating operation(s). In certain embodiments, solder may be a tin-silver solder alloy solder, a tin-silver-copper alloy solder, etc. The solder may be about 20 microns in thickness; although other dimensions are also contemplated by the invention such as, for example, a range of about between 2 to 30 microns.

Figure 5:
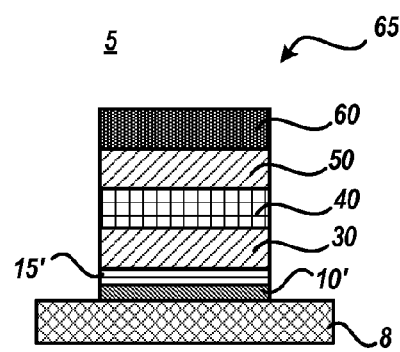

FIG. 5 shows structure 5 at a stage of fabrication wherein photoresist material 20 is removed and portions of conductive layer 15 and/or portions of the liner 10 are removed exterior to layered contact 65. The photoresist 20 may be stripped using conventional strippers. For example, the photoresist 20 can be stripped using TMAH with a high pH content, with glycol to assist in swelling and NMP to aid in dissolution. Alternatively, the photoresist 20 can be stripped using sodium or potassium hydroxide. The portions of conductive layer 15 and/or portions of the liner 10 may be stripped by, for example, utilizing photolithography and a wet etch, dry etch, or combination. In other embodiments, portions of conductive layer 15 may be removed by other known processes such as, for example, liquid or gas flux techniques. In certain embodiments only the portions of conductive layer 15 (as opposed to portions of conductive layer 15 and portions of liner 10, etc.) exterior to layered contact 65 are removed. In such embodiments, liner 10 may be retained to e.g. limit pillar contact undercuts, etc. and removed in later fabrication stages, etc.

Upon the removal of photoresist 20 and portions of conductive layer 15 and/or liner 10 contact structure 65 is formed and may include a retained liner 10', a retained conductive layer 15', Nickel layer 30, Copper layer 40, Nickel layer 50, NiFe layer 60, etc. The width/diameter of contact structure 65 is generally similar to the width of the trench of photoresist 20. In certain embodiments, an argon/oxygen or nitrogen RIE ash may be performed to refresh the retained surfaces of structure 5 subsequent to the removal of photoresist 20 and or removal of the portions of conductive layer 15 and liner 10. The contact structure 65 shown in FIG. 5 may be formed by other known or additional techniques than those described without deviating from the spirit of those embodiments herein claimed.

Figure 6:
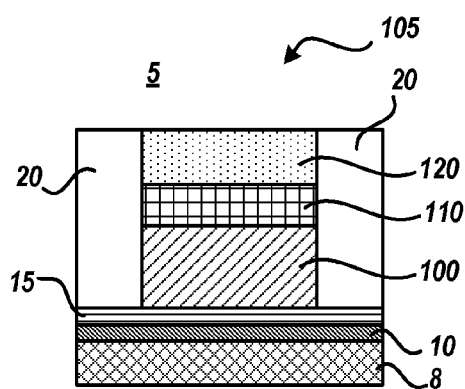

FIG. 6 shows structure 5 at a stage of fabrication wherein a layered contact 105 is formed within trench 25. In embodiments, layered contact 105 comprises a Nickel layer 100 formed upon the exposed conductive layer 15 within trench 25, a Copper layer 110 formed upon Nickel layer 100 within trench 25, and a Tin layer 120 formed upon Copper layer 110 within trench 25. In various embodiments, Nickel layer 100, Copper layer 110, and Tin layer 120 are formed by plating operations. Nickel layer 100 may be about 2 microns in thickness, Copper layer 110 may be 1 microns in thickness, and Tin layer 120 may be 1.5 microns in thickness; although other dimensions are also contemplated by the invention such as, for example, a range of about between 0.5 to 15 microns.

In certain embodiments contact 105 may be formed as a pillar contact of an exemplary thickness of 20 to 60 microns, etc. In embodiments, the upper surface of Tin layer 120 may be subjected to a RIE process to clean the surface thereof. In certain embodiments, solder may be formed upon Tin layer 120 within trench 25. More particularly, solder may be deposited upon the Tin layer 120 using, for example, another plating operation(s).

Figure 7:
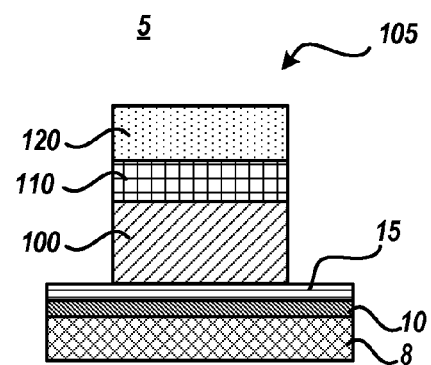
Figure 8:
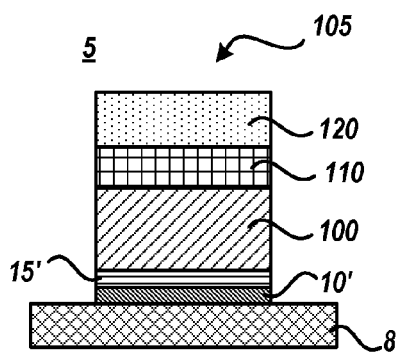

FIG. 7 shows structure 5 at a stage of fabrication wherein photoresist material 20 is removed. FIG. 8 shows structure 5 at a stage of fabrication wherein portions of conductive layer 15 and/or portions of the liner 10 are removed exterior to layered contact 105. In certain embodiments only the portions of conductive layer 15 (as opposed to portions of conductive layer 15 and portions of liner 10, etc.) exterior to layered contact 105 are removed. In such embodiments, liner 10 may be retained to e.g. limit pillar contact undercuts, etc. and removed in later fabrication stages, etc. Upon the removal of photoresist 20 and portions of conductive layer 15 and/or liner 10 contact structure 105 is formed and may include a retained liner 10', a retained conductive layer 15', Nickel layer 100, Copper layer 110, and Tin layer 120, etc. The width/diameter of contact structure 105 is generally similar to the width of the trench of photoresist 20. The contact structure 105 shown in FIG. 7 may be formed by other known or additional techniques than those described without deviating from the spirit of those embodiments herein claimed.

Figure 9:
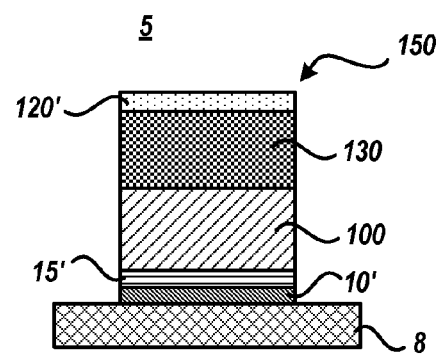

FIG. 9 shows structure 5 at a stage of fabrication wherein a reflow or heating operation is performed to form multilayer contact 150. The reflow operation forms a Copper Tin layer 130 from Copper layer 110 and from Tin layer 120. For example, the reflow operation partially converts the Tin layer 120 and fully converts the Copper layer 110 into the Copper Tin layer 130. The remaining portion of Tin layer 120 is indicated as Tin layer 120'. In certain embodiments, the Copper Tin layer 130 is a $Cu_6Sn_5$ layer. In certain embodiments, subsequent to the reflow operation, Copper Tin layer 120 may be 2 microns in thickness, and Tin layer 120' may be 0.5 microns in thickness; although other dimensions are also contemplated by the invention such as, for example, a range of about between 0.1 to 15 microns. In embodiments, layered contact 150 may include the retained liner 10', the retained conductive layer 15', Nickel layer 100, Copper Tin layer 130, and Tin layer 120', etc.

In certain embodiments, the Nickel/Copper/Nickel layer combination of contact 65 remains as distinct layers even after subsequent heat treatments. This Ni/Cu/Ni layer combination may prevent consumption of conductive layer 15 that would otherwise occur when solder contacts the conductive layer 15. In certain embodiments, after a heating, the Nickel/Copper/Tin combination of contact 105 forms the subsequent metallurgical layered stack of Cu/Ni/Cu6Sn5 of contact 150. It is specifically noted that or other metallurgical layer variations of contact 150 are possible depending on thickness of deposited layers and length of heat treatment. In certain embodiments, specific heat treatments may be chosen to achieve the intermetallic $Cu_6Sn_5$ as Copper Tin layer 130 since $Cu_6Sn_5$ is a wettable Cu—Sn intermetallic (in contrast to $Cu_3Sn$, etc.).

In certain embodiments the thickness of Tin layer 120 may be chosen to provide for excess Tin to react with the underlying Copper layer 110 during the heating operation to form the $Cu_6Sn_3$ specie Copper Tin layer 130. In certain embodiments, it is beneficial for Tin layer 120 to be twice the thickness of Tin needed to form the $Cu_6Sn_3$ specie. For example, the Tin layer 120 may be typically at least 1.0 micron of Sn, SnAg, etc.

Figure 10A:
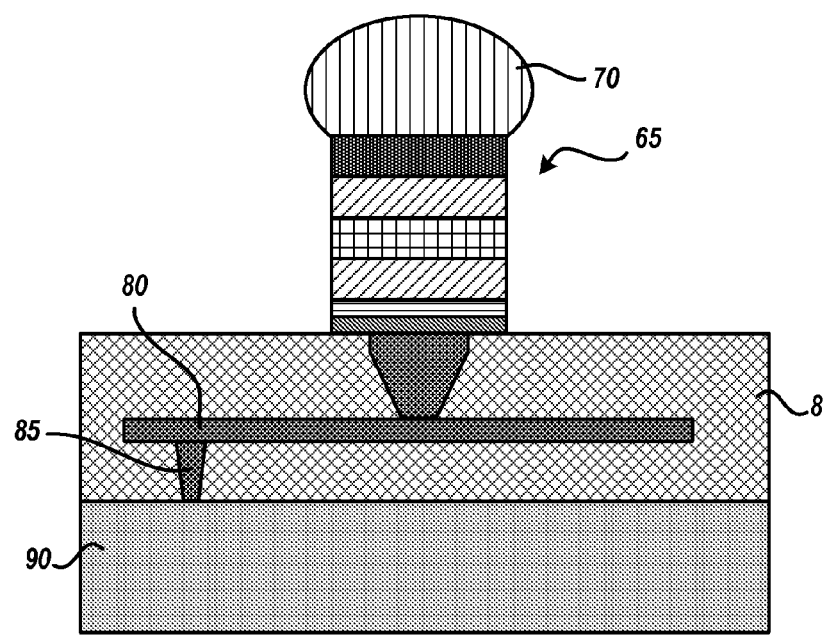
FIG. 10A and FIG. 10B depict semiconductor devices, according to embodiments of the invention.
Figure 10B:
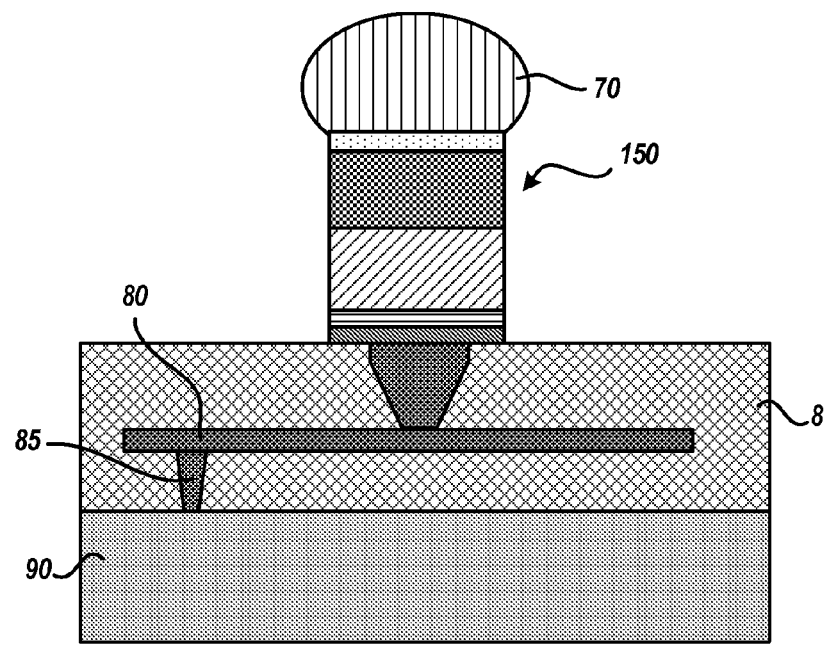

FIG. 10A and FIG. 10B shows structures implementing contact 65 and contact 150, respectively. Although FIG. 10A and FIG. 10B shows a single contact structure, it should be understood by those of skill in the art that a plurality of contact structures can be formed on the surface of the structure using the fabrication processes above. In the example of FIG. 10A and FIG. 10B, one or more dielectric layers 8 are formed upon a semiconductor substrate 90. The substrate 90 may be, for example, silicon or other known substrates for semiconductor devices. A metal interconnect(s) 85 and connecting metal line(s) 80 may be formed in the one or more dielectric layers 8 using conventional damascene and deposition processes. A via is formed in an the dielectric layers 8 and the liner 10 may be formed thereon. In embodiments, liner 10 is in contact with the underlying wiring line 80. The contact 65 or contact 150 is formed in accordance with the various embodiments as described herein.

Figure 11A:
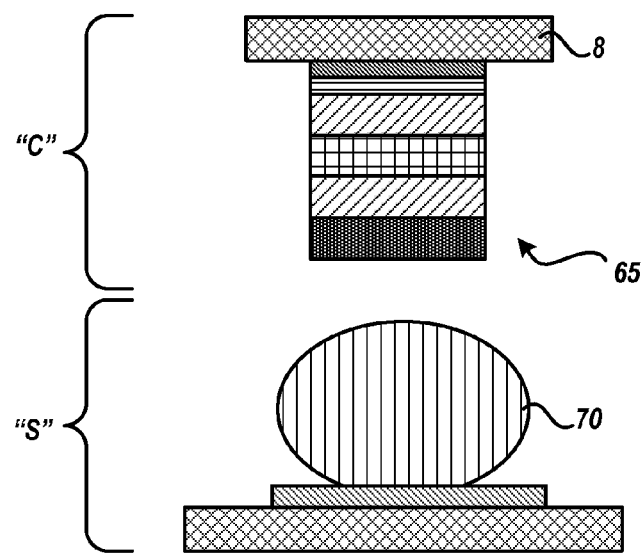
FIG. 11A and FIG. 11B depict a semiconductor chip-to-package interconnect structure, according to embodiments of the invention.
Figure 11B:
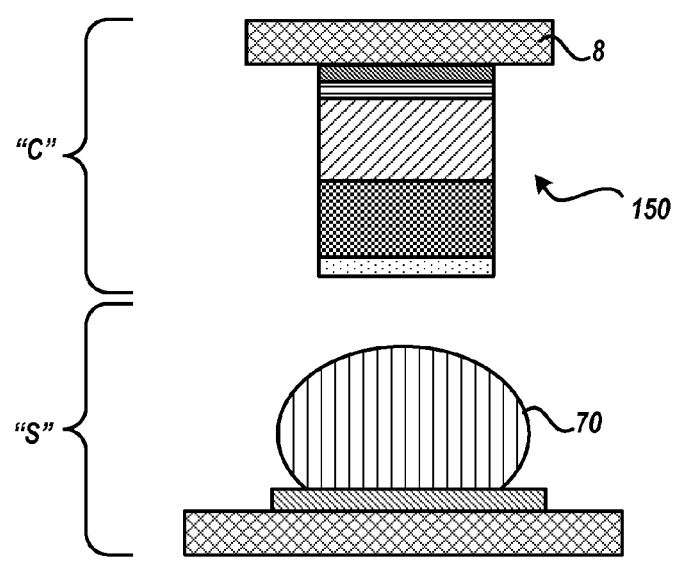

In embodiments of the invention, solder 70 may be connected to the chip or to a carrier or package substrate. For example, solder can be applied to the package substrate in almost all instances, with the exception of some ceramic carriers. It is contemplated that the solder can be attached to the contact 65 or contact 150 comprised within a chip (e.g. see FIG. 10A and FIG. 10B) or from the package or carrier (e.g. see FIG. 11A and FIG. 11B). Therefore, in embodiments, contact 65 or contact 150 can be completely devoid of any solder and still be joined to the package or carrier. By way of example, FIG. 11A and FIG. 11B shows a chip "C" and a package substrate "S". Solder 70 is provided on the package substrate S for joining the chip "C" and package substrate "S". As noted above, the contact 65 or contact 150 of the chip does not need solder, as it can connect to e.g. a contact pad upon the package substrate with the solder 70 on the substrate S.

In certain embodiments, a three dimensional chip stack includes a first chip that includes a plurality of contacts having solder wetted thereto. A second chip (e.g. a thinned die, etc.) that includes a plurality of receiving pads that which the solder may be reflowed to electrically connect the contacts with the receiving pads. The receiving pad may be formed on the top of the second chip prior to thinning the back of the second chip. In such embodiments, in order to prevent the second chip from breaking during backside thinning, a temporary glass substrate may be adhered to the top for support. After thinning, the glass substrate is removed, but adhesive interacts with traditional copper receiving pads making them non-wettable to solder. Thus, the second chip cannot receive the solder of the first chip. Other known, unacceptable receiving pad materials are Gold on top of Nickel or Palladium on top of Nickel.

Therefore, in the various embodiments of the present invention, contact 65 and contact 150 include appropriate layered metallurgy to avoid the transfer of adhesive to the contacts during adhesive removal during e.g. wafer, chip fabrication, etc., to enable contact 65 and contact 150 to be wettable to solder, and to enable an improved electrical interface during chip-to-package assembly and improved electromigration performance.

In embodiments, contact 65 and contact 150 includes solder wettable portions. For example, solder wetting occurs upon the upper surface and sidewalls of NiFe layer 60. Further, solder wetting occurs upon the upper surface and sidewalls of Sn layer 120' and sidewalls of Copper Tin layer 130.

Figure 12:
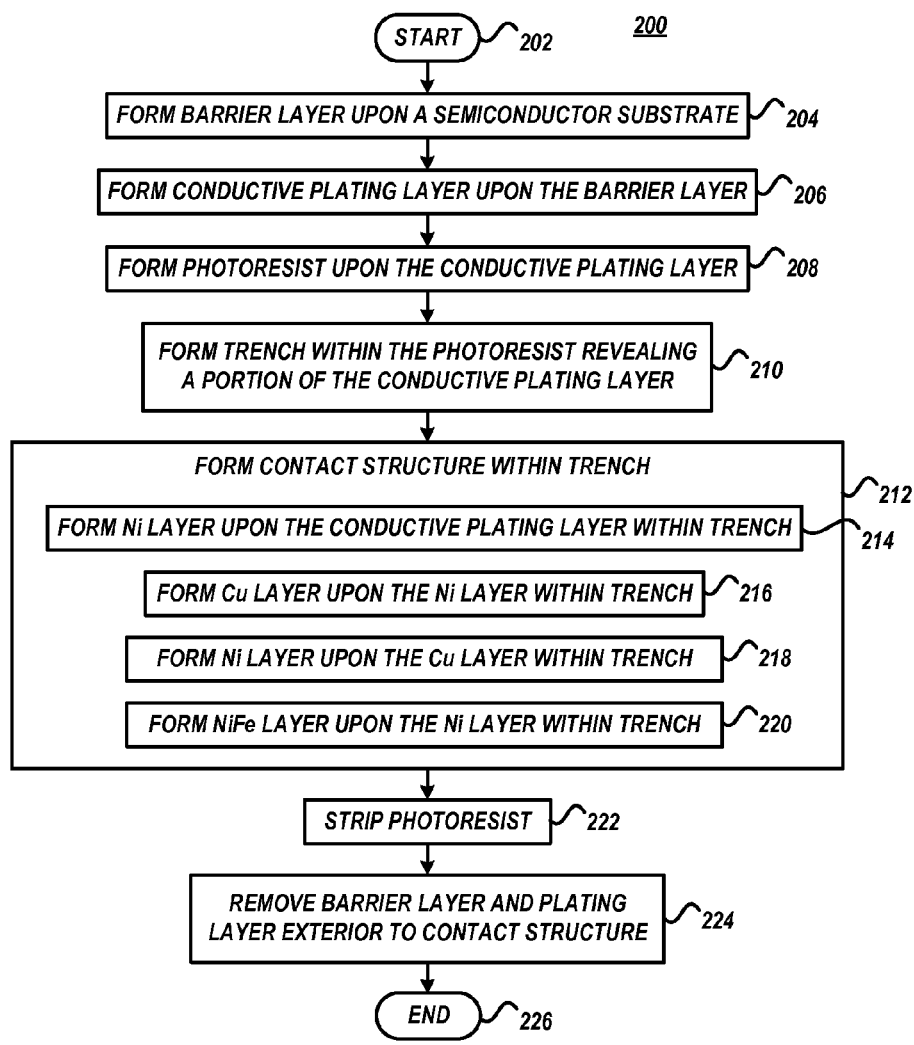
FIG. 12 and FIG. 13 depict exemplary semiconductor device fabrication flow methods, according to embodiments of the invention.

FIG. 12 depicts an exemplary semiconductor device fabrication method 200, in accordance with various embodiments of the present invention. Method 200 may be utilized in implementations where it may be beneficial for electrical contacts (e.g. pillars, pads, etc.) to be wettable to solder and to reduce adhesive (e.g. utilized to attach a handler to the contact side of the semiconductor device, etc.) from transferring or reacting with the electrical contacts.

Method 200 begins at block 202 by forming a barrier layer being upon a dielectric such as a semiconductor substrate (block 204). More particularly, liner 10 may be formed on dielectric layer 8. Method 200 may continue by forming a conductive plating layer upon the barrier layer (block 206). More particularly conductive layer 15 may be formed upon liner 10. Method 200 may continue by forming a photoresist upon the conductive plating layer (block 208). More particularly, photoresist material 20 may be deposited on conductive layer 15.

Method 200 may continue by subjecting photoresist material to lithographic and etching processes to form a trench revealing a portion of the conductive plating layer (block 210). More particularly, a contact trench 25 may be formed by removing a portion of photoresist material 20 that exposes a portion of the conductive layer 15.

Thereafter, method 200 may continue by forming a contact structure within the trench (block 212). For example, contact 65 may be formed by depositing (e.g. electrodeposition plating, etc.) Nickel layer 30 upon the exposed conductive layer 15 within trench 25 (block 214), depositing a Copper layer 40 upon Nickel layer 30 within trench 25 (block 216), depositing Nickel layer 50 upon Copper layer 40 within trench 25 (block 218), and depositing a NiFe layer 60 upon Nickel layer 50 within trench 25 (block 220).

Method 200 may continue with removing photoresist (block 222). For example, photoresist material 20 may be etched. Method 200 may continue with removing the barrier layer and/or plating layer exterior to the contact (block 224). For example, the liner 10 and the conductive layer 15 may be removed such that the sidewalls of the liner 10 and the sidewalls of the conductive layer 15 are coplanar with the sidewalls of the Nickel layer 30, the sidewalls of the Copper layer 40, the sidewalls of the Nickel layer 50, and/or the sidewalls of the NiFe layer 60. Method 200 ends at block 226.

Figure 13:
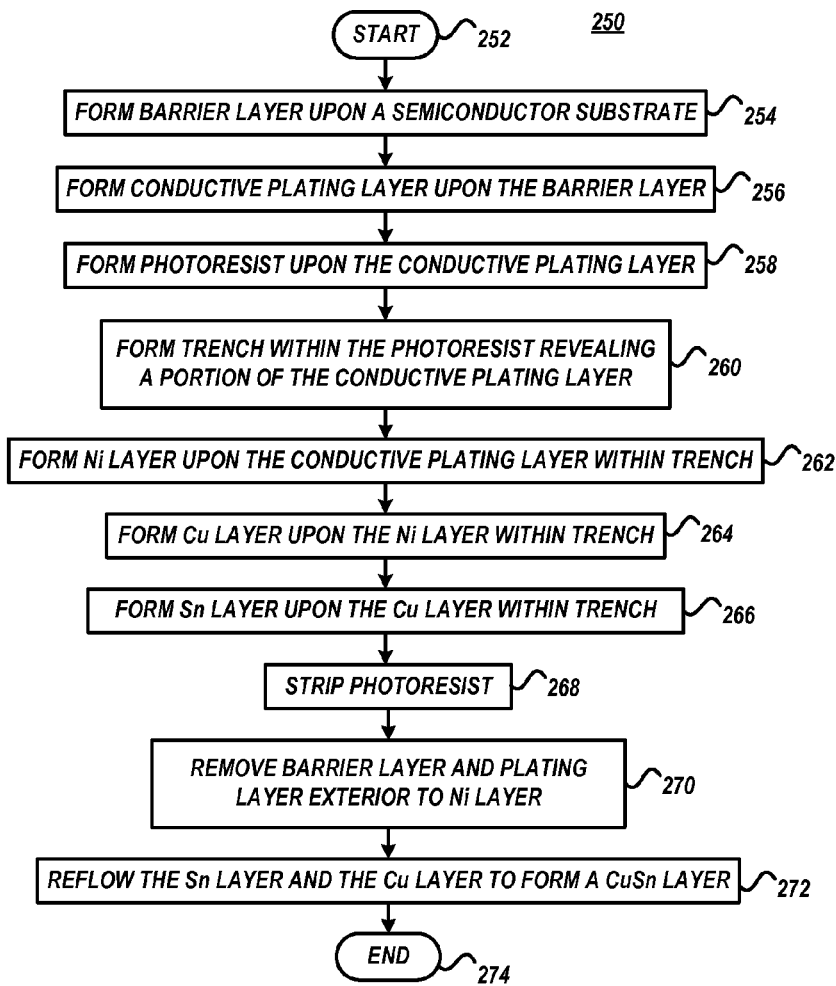

FIG. 13 depicts an exemplary semiconductor device fabrication method 250, in accordance with various embodiments of the present invention. Method 205 may be utilized in implementations where it may be beneficial for electrical contacts (e.g. pillars, pads, etc.) to be wettable to solder and to reduce adhesive from transferring or reacting with the electrical contacts.

Method 250 begins at block 252 by forming a barrier layer being upon a dielectric such as a semiconductor substrate (block 254). More particularly, liner 10 may be formed on dielectric layer 8. Method 250 may continue by forming a conductive plating layer upon the barrier layer (block 256). More particularly conductive layer 15 may be formed upon liner 10. Method 250 may continue by forming a photoresist upon the conductive plating layer (block 258). More particularly, photoresist material 20 may be deposited on conductive layer 15.

Method 250 may continue by subjecting photoresist material to lithographic and etching processes to form a trench revealing a portion of the conductive plating layer (block 260). More particularly, a contact trench 25 may be formed by removing a portion of photoresist material 20 that exposes a portion of the conductive layer 15.

Thereafter, method 250 may continue by forming a contact structure within the trench. For example, contact 105 may be formed by depositing (e.g. electrodeposition plating, etc.) Nickel layer 100 upon the exposed conductive layer 15 within trench 25 (block 262), depositing a Copper layer 110 upon Nickel layer 100 within trench 25 (block 264), and depositing Tin layer 120 upon Copper layer 110 within trench 25 (block 266).

Method 250 may continue with removing photoresist (block 268) and may continue with removing the barrier layer and/or plating layer exterior to the contact (block 270). For example, the liner 10 and the conductive layer 15 may be removed such that the sidewalls of the liner 10 and the sidewalls of the conductive layer 15 are coplanar with the sidewalls of the Nickel layer 100, the sidewalls of the Copper layer 110, and/or the sidewalls of the Tin layer 120.

Method 250 may continue with heat treating the contact to reflow at these two of the layers (block 272). For example, the contact 105 may be heat treated such that the Tin layer 120 partially or fully reflows with the underlying Copper layer 110 to form an intermetallic Tin Copper layer 130 (e.g. $Cu_6Sn_3$, etc.). If the Tin layer 120 is partially reflowed, a Tin layer 120' may be retained upon the Tin Copper layer 130. Method 250 ends at block 274.

Figure 14:
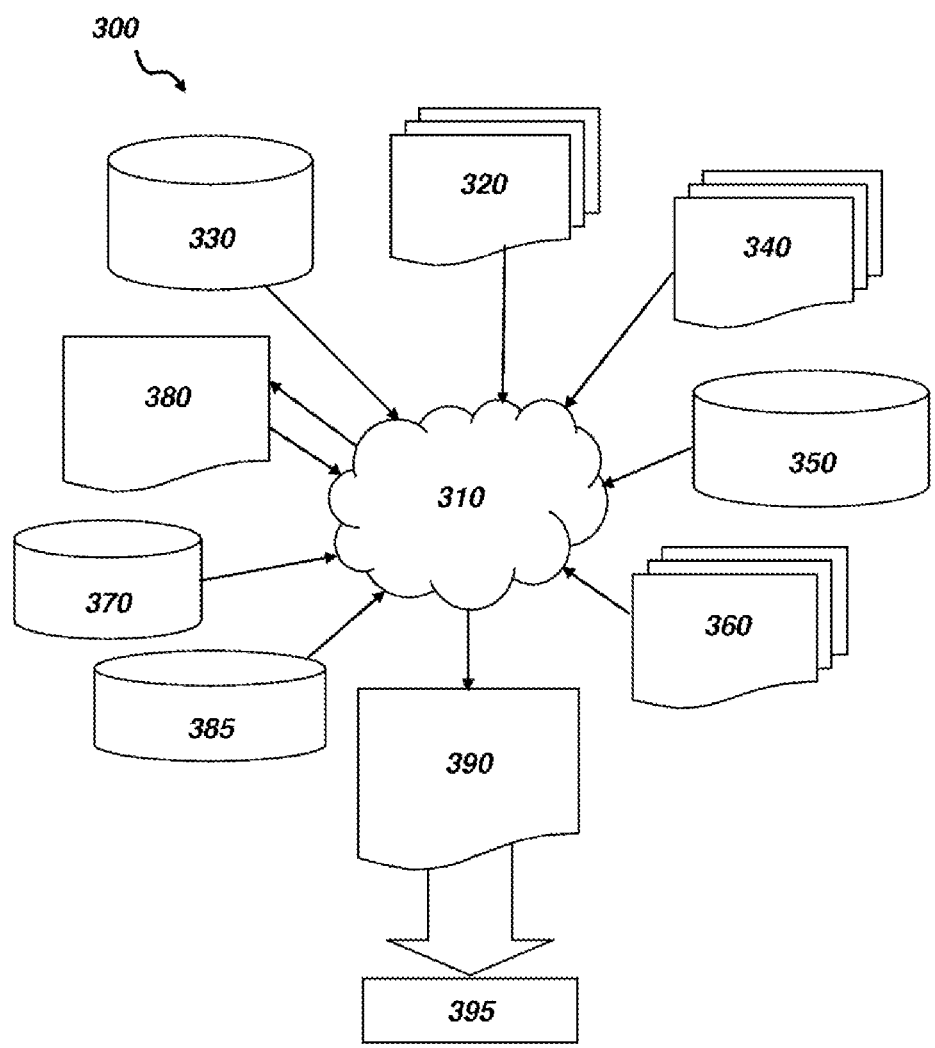
FIG. 14 depicts a flow diagram of a design process used in semiconductor device design, manufacture, and/or test, according to embodiments of the invention.

Referring now to FIG. 14, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIG. 2-11B.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIG. 2-11B. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIG. 2-11B. to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2-11B. In one embodiment, design structure 390 may comprise a compiled, executable HDL simulation model that functionally simulates the devices shown in FIG. 2-11B.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2-11B. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication method comprising:
   forming a barrier layer upon a dielectric layer, the barrier layer being a TiW layer;
   forming an electrically conductive plating layer upon the barrier layer, the plating layer being composed of Cu; and
   forming a multilayered contact upon the plating layer by plating a Nickel layer upon the plating layer, plating a Copper layer upon the Nickel layer, and plating a Tin layer upon the Copper layer; and
   heat treating the multilayered contact to reflow the Tin layer with the Copper layer to form a Copper-Tin layer, wherein the heat treating fully converts the Copper layer into the Copper-Tin layer such that the Copper-Tin layer is directly upon the Nickel layer; and
   the heat treating partially converts the Tin layer into the Copper-Tin layer such that a remaining portion of the Tin layer is retained upon the Copper-Tin layer, and further comprising forming solder on the remaining portion of the Tin layer.

2. The semiconductor device fabrication method of claim 1, further comprising:
   heat treating the multilayered contact to at least partially reflow the Tin layer with the Copper layer to form a Copper-Tin layer.

3. The semiconductor device fabrication method of claim 2, wherein the heat treating fully converts the Copper layer into the Copper-Tin layer such that the Copper-Tin layer is directly upon the Nickel layer.

4. The semiconductor device fabrication method of claim 2, wherein a portion of the Tin layer is retained upon the Copper-Tin layer.

5. The semiconductor device fabrication method of claim 1, further comprising:
   attaching a handler wafer to the multilayered contact side of the semiconductor device with adhesive.

6. The semiconductor device fabrication method of claim 1, further comprising: forming a photoresist upon the conductive layer;
   forming a contact trench in the photoresist layer, the contact trench exposing a portion of the conductive layer;
   forming the multilayered contact structure within the contact trench, and;
   removing the photoresist.

7. The semiconductor device fabrication method of claim 1, further comprising:
   removing portions of the conductive layer exterior to the multilayered contact structure, such that sidewalls of the conductive layer are coplanar with sidewalls of the Nickel layer, sidewalls of the Copper layer, and sidewalls of the Tin layer of the multilayered contact.

8. The semiconductor device fabrication method of claim 1, further comprising:
   removing portions of the barrier layer exterior to the multilayered contact structure, such that sidewalls of the barrier layer are coplanar with sidewalls of the Nickel layer, sidewalls of the Copper layer, and sidewalls of the Tin layer of the multilayered contact.

9. The semiconductor device fabrication method of claim 1, wherein the multilayered contact is a capture pad.

10. The semiconductor device fabrication method of claim 1, wherein the semiconductor device is a thinned die and wherein at least one layer of the multilayer contact is wettable to solder electrically connected to a second die in a three dimensional package.

11. The semiconductor device fabrication method of claim 1, wherein:
    the barrier layer has a thickness in a range of 0.125 microns to 0.205 microns;
    the plating layer has a thickness in a range of 0.1 microns to 0.6 microns;
    the Nickel layer has a thickness of 2 microns,
    the Copper layer has a thickness of 1 micron, and
    the Tin layer has a thickness of 1.5 microns.

12. The semiconductor device fabrication method of claim 1, further comprising forming a metal interconnect and a metal line in the dielectric layer using damascene and deposition processes,
    wherein the barrier layer directly contacts a via formed in the dielectric layer;
    the via contacts one of the metal lines; and
    the dielectric layer is formed on a semiconductor substrate.

13. The semiconductor device fabrication method of claim 1, wherein the multi-layered contact is part of a chip and is devoid of solder, and further comprising forming solder on a package substrate prior to joining the multilayer contact to the solder.

14. The semiconductor device fabrication method of claim 1, wherein:
    the Copper-Tin layer is 2 microns thick; and
    the remaining portion of the Tin layer is 0.5 microns thick.

15. The semiconductor device fabrication method of claim 1, further comprising forming a metal interconnect and a metal line in the dielectric layer using damascene and deposition processes,
    wherein the barrier layer directly contacts a via formed in the dielectric layer;
    the via contacts one of the metal lines; and
    the dielectric layer is formed on a semiconductor substrate.

16. A semiconductor device :fabrication method comprising:
    forming a barrier layer upon a dielectric layer, the barrier layer being a TiW layer;
    forming an electrically conductive plating layer upon the barrier layer, the plating layer being composed of Cu;
    forming a multilayered contact upon the plating layer by plating a Nickel layer upon the plating layer. plating a Copper layer upon the Nickel layer, and plating a Tin layer upon the Copper layer; and
    heat treating the multilayered contact to reflow the Tin layer with the Copper layer to form a Copper-Tin layer, wherein the heat treating fully converts the Copper layer into the Copper-Tin layer such that the Copper-Tin layer is directly upon the Nickel layer;
the heat treating partially converts the Tin layer into the Copper-Tin layer such that a remaining portion of the Tin layer is retained upon the Copper-Tin layer;
the TiW layer is 0.125 microns to 0.205 microns thick;
the plating layer is 0.1 microns to 0.6 microns thick;
the Nickel layer is 2 microns thick;
the Copper-Tin layer is 2 microns thick; and
the remaining portion of the Tin layer is 0.5 microns thick.

17. A semiconductor device fabrication method comprising:
   forming a barrier layer upon a dielectric layer. the barrier layer being a TiW layer;
   forming an electrically conductive plating layer upon the barrier layer, the plating layer being composed of Cu;
   forming a multilayered contact upon the plating layer by plating a Nickel layer upon the plating layer. plating a Copper layer upon the Nickel layer, and plating a Tin layer upon the Copper layer; and
   heat treating the multilayered contact to reflow the Tin layer with the Copper layer to form a Copper-Tin layer,
   wherein the heat treating fully converts the Copper layer into the Copper-Tin layer such that the Copper-Tin layer is directly upon the Nickel layer;
   the heat treating partially converts the Tin layer into the Copper-Tin layer such that a remaining portion of the Tin layer is retained upon the Copper-Tin laver; and
   the Copper-Tin layer is a $Cu_6Sn_3$ layer.

* * * * *